United States Patent
Deshpande et al.

(10) Patent No.: US 12,354,657 B2
(45) Date of Patent: Jul. 8, 2025

(54) REDUCING PRECHARGE CURRENT SURGE IN DIGITAL COMPUTE IN MEMORY

(71) Applicant: MediaTek Inc., Hsin-Chu (TW)

(72) Inventors: Chetan Deshpande, San Jose, CA (US); Gajanan Sahebrao Jedhe, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 180 days.

(21) Appl. No.: 18/175,514

(22) Filed: Feb. 27, 2023

(65) Prior Publication Data

US 2023/0307047 A1   Sep. 28, 2023

Related U.S. Application Data

(60) Provisional application No. 63/322,253, filed on Mar. 22, 2022.

(51) Int. Cl.
*G11C 7/10* (2006.01)
*G11C 7/12* (2006.01)
*G11C 11/419* (2006.01)
*G11C 11/54* (2006.01)
*G11C 15/04* (2006.01)

(52) U.S. Cl.
CPC ............ *G11C 15/04* (2013.01); *G11C 7/1006* (2013.01); *G11C 7/1096* (2013.01); *G11C 7/12* (2013.01); *G11C 11/419* (2013.01); *G11C 11/54* (2013.01)

(58) Field of Classification Search
CPC ..... G11C 15/04; G11C 7/1006; G11C 11/419; G11C 11/54; G11C 7/1096; G06F 7/5443
See application file for complete search history.

(56) References Cited

U.S. PATENT DOCUMENTS

| | | | | |
|---|---|---|---|---|
| 5,203,003 A * | 4/1993 | Donner | ................ | G06F 9/3869 712/228 |
| 5,557,620 A * | 9/1996 | Miller, Jr. | .......... | G01R 31/3004 714/733 |
| 5,740,420 A * | 4/1998 | Palaniswami | ....... | G06F 9/30145 711/219 |
| 5,764,089 A * | 6/1998 | Partovi | ................ | H03K 3/037 327/212 |
| 5,815,005 A * | 9/1998 | Bosshart | ............ | H03K 19/0963 326/95 |
| 11,018,687 B1 | 5/2021 | Srivastava | | |
| 11,176,991 B1* | 11/2021 | Shaik | .................. | G11C 11/4096 |
| 2002/0145451 A1* | 10/2002 | Ananthanarayanan | ..................... | H03K 19/09441 326/115 |
| 2003/0117170 A1* | 6/2003 | Meneghini | ......... | H03K 19/0963 326/52 |

(Continued)

OTHER PUBLICATIONS

Extended European Search Report for European Application No. 23162958.5 dated Aug. 14, 2023.

*Primary Examiner* — Jay W. Radke
(74) *Attorney, Agent, or Firm* — Winston Hsu

(57) ABSTRACT

A compute-in-memory (CIM) device includes a memory cell and calculation circuitry configured to perform a calculation based on an input value and a value stored in the memory cell, and to provide a signal at an output node based on the calculation. The CIM device also includes write circuitry configured to perform a write operation on the memory cell and precharge circuitry configured to precharge the output node in response to the write circuitry performing the write operation.

18 Claims, 4 Drawing Sheets

(56) References Cited

U.S. PATENT DOCUMENTS

2004/0015648 A1     1/2004   Henderson et al.
2020/0403616 A1*   12/2020   Shu ..................... H03K 19/215
2021/0375362 A1    12/2021   Yabuuchi

* cited by examiner

REDUCING PRECHARGE CURRENT SURGE IN DIGITAL COMPUTE IN MEMORY

CROSS-REFERENCE TO RELATED APPLICATIONS

This application claims priority to and the benefit of U.S. Provisional Application Ser. No. 63/322,253, filed Mar. 22, 2022 and entitled "METHOD AND APPARATUS FOR REDUCING CURRENT SURGE IN MULTIPLY AND ACCUMULATE (MAC) OPERATION IN A MEMORY ARRAY," which is hereby incorporated herein by reference in its entirety.

BACKGROUND

In conventional computing devices, a memory functional block is separate from a processor functional block. Data is fetched from the memory to perform operations in the processor functional block.

Compute-in-memory (CIM) devices are devices in which operations may be performed in the memory. Such architectures may have the benefit of improved speed or lower power consumption. One example of an application for CIM devices is an implementing neural networks. Neural networks make extensive use of multiply accumulate operations, in which inputs are multiplied by filter weights and the products are summed. CIM devices may include hardware for performing the multiply and accumulate operations as well as memory cells for storing the filter weights.

SUMMARY

Some aspects relate to a compute-in-memory (CIM) device, comprising: a memory cell; calculation circuitry configured to perform a calculation based on an input value and a value stored in the memory cell, and to provide a signal at an output node based on the calculation; write circuitry configured to perform a write operation on the memory cell; and precharge circuitry configured to precharge the output node in response to the write circuitry performing the write operation.

Some aspects relate to a compute-in-memory (CIM) method, comprising: performing a write operation on a memory cell; precharging an output node in response to the performing of the write operation; and performing a calculation based on an input value and a value stored in the memory cell and providing a signal at an output node based on the calculation.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

The devices and techniques described herein allow for reducing the peak current in a compute-in-memory (CIM) device due to a pre charge operation. The inventors have recognized and appreciated that if a precharge operation is performed in response to a compute operation, many cells may be precharged at the same time, leading to a high peak current, pre charging all of the cells at once may lead to a high peak current during precharge. The inventors have further recognized and appreciated that data is written to a row of memory cells prior to performing a compute operation. Accordingly, described herein are techniques and devices for performing precharge for a row of cells in response to a write operation being commanded for the corresponding row of memory cells. Since write operations are performed one row at a time, the current draw during precharge can be limited to a fraction of the current draw if all rows of cells are precharged simultaneously. Such techniques and devices may also have the advantage of reducing power consumption. An adder tree that receives results of multiplications may have its input values initially set to zero as a result of the precharging, which may help to reduce glitch power in the adder tree.

Figure 1:
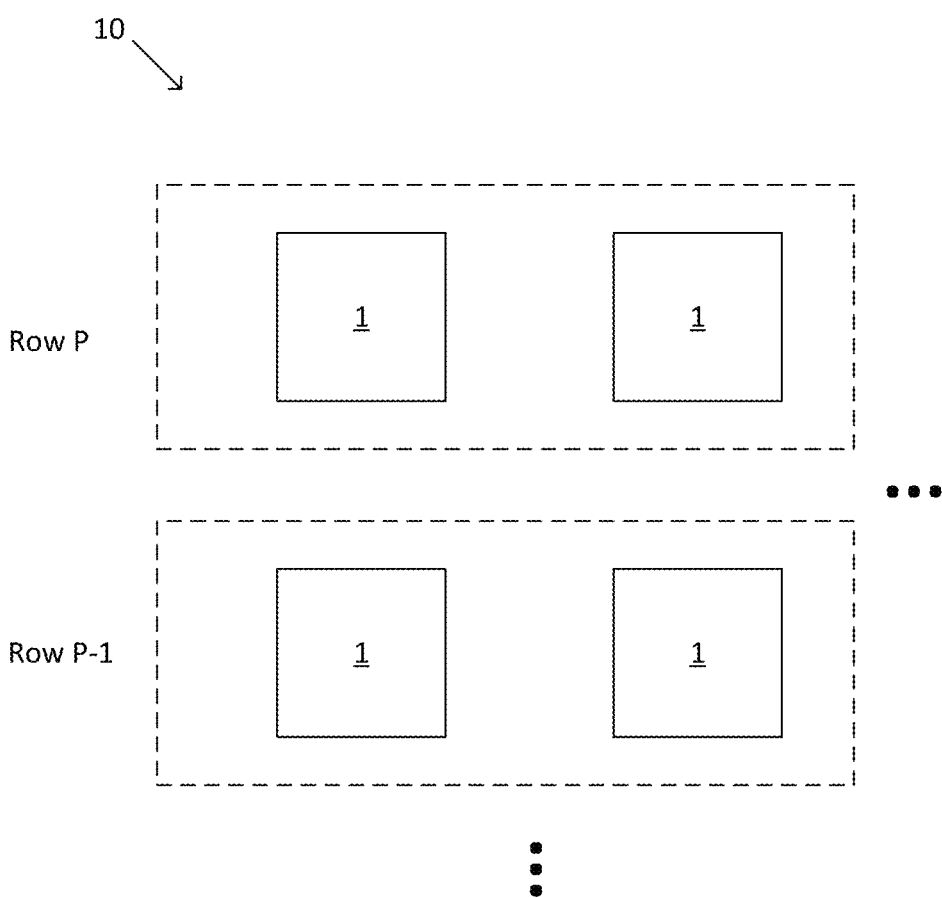
FIG. 1 illustrates a high-level block diagram of a compute-in-memory (CIM) device having an array of CIM cells arranged in rows and columns.

FIG. 1 illustrates a high-level block diagram of a compute-in-memory (CIM) device 10 having an array of CIM cells 1 arranged in rows and columns. The CIM device 10 may have any number of rows and columns. Each CIM cell 1 has a memory cell and associated calculation circuitry, as discussed further below. The calculation circuitry needs to be precharged before performing a compute operation. According to prior techniques, when the CIM device 10 is controlled to perform a compute operation, the calculation circuitry for all of the CIM cells 1 is precharged simultaneously prior to performing the compute operation. Since there may be a large number of CIM cells 1 in the CIM device 10, the peak current drawn by the CIM device 10 during precharge may be high when all the CIM cells 1 are precharged at the same time.

As mentioned above, the inventors have recognized and appreciated that a write operation needs to be performed to write data to all the CIM cells 1 of the CIM device 10 before a compute operation can be performed. The inventors have further appreciated that the calculation circuitry for a row is unused during a write operation. Write operations in the CIM device 10 may be performed one row at a time. Accordingly, according to some embodiments, precharge for a row of CIM cells 1 may be performed during a write operation for the row of CIM cells 1, which spreads out the current draw over time and reduces peak current draw for the CIM device 10.

Figure 2:
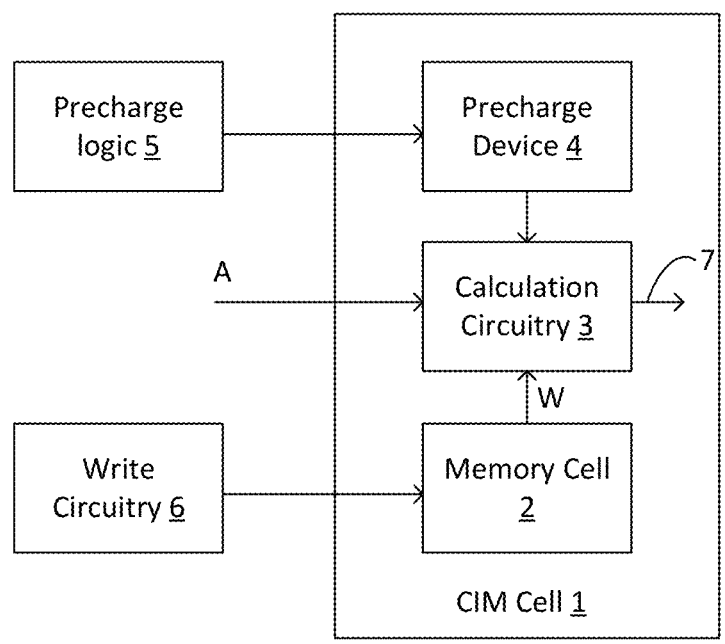
FIG. 2 is a block diagram showing functional circuit blocks of a CIM cell and functional circuit blocks that provide signals to a CIM cell.

FIG. 2 is a block diagram showing functional circuit blocks of a CIM cell 1 and functional circuit blocks that provide signals to a CIM cell 1. The CIM cell 1 includes a memory cell 2, calculation circuitry 3 that performs calculations based on an input A and the value W stored in the memory cell, and a precharge device 4 that precharges a node of the calculation circuitry 3. Precharge logic 5 controls the precharge device 4 to precharge the output node 7 of the calculation circuitry 3 at the same time that the write circuitry 6 writes a value into the memory cell 2. In some cases, the precharge logic 5 may control precharge device 4 to perform a precharge operation for a row of CIM cells 1 in response to a signal from the write circuitry 6 indicating that a write (no compute) operation is being performed for the row of CIM cells 1. At the same time a row of the CIM device 10 performs a write operation to write data to the memory cells 2 of the row of CIM cells 1, the precharge logic 5 controls the precharge devices 4 in the same row of CIM cells 1 to perform a precharge operation. After the precharge operation, the precharge device 4 is turned off. The calculation circuitry 3 is then ready to perform a calculation using the input A and the value W stored in the memory cell 2 when the CIM device 10 performs a compute operation. When the CIM device 10 controls calculation circuitry 3 to perform a compute operation, the result of the calculation is provided to output node 7. The memory cell 2 may be any suitable type of memory cell, such as a static random access memory (SRAM) cell or a ternary content addressable memory (TCAM) cell, for example.

Figure 3:
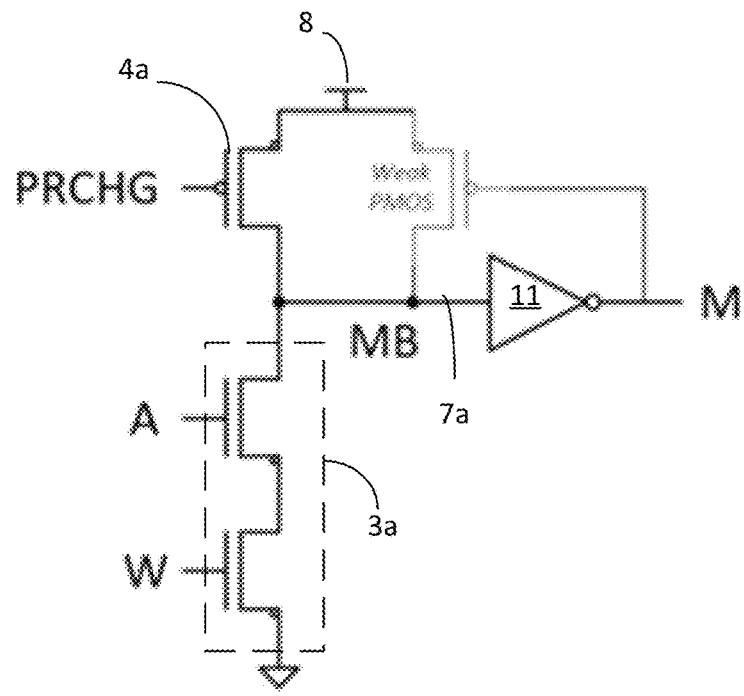
FIG. 3 shows additional detail of one example of a CIM cell in which calculation circuitry is configured to perform multiplication of the input A and value W stored in a memory cell.

FIG. 3 shows additional detail of one example of a CIM cell. In this example, the calculation circuitry 3*a* is configured to perform multiplication of the input A and value W stored in the memory cell 2. When a write operation is performed for the row including the CIM cell, the precharge logic 5 provides a signal PRCHG that controls precharge device 4*a* to precharge the output node 7*a*, also shown as node MB. The precharge device 4*a* may be a PMOS transistor that is controlled to perform the precharge operation in response to signal PRCHG having low logic level. During the precharge operation the precharge device 4*a* is conductive, and connects output node 7*a* to the power rail 8. The CIM cell 1 may include an inverter 11 that inverts signal MB to produce signal M. Signal M may be provided to an adder tree to perform the addition portion of a multiply-accumulate calculation. Advantageously, precharging the output note 7*a* provides a signal M having a low logic value. When a number of rows of the CIM device 10 are precharged and provide signals M having a low logic value the adder tree may have reduced power consumption. When a compute operation is performed the input A is multiplied by the value W stored in the memory cell 2. Values A and W may be digital values. If both A and W are logic high, the output node 7*a* is pulled down to ground (logic low). If either A or W or both are logic low, the output node 7*a* is not pulled down to ground and instead remains at the precharge voltage (logic high, in this example). The CIM cell 1 may include circuitry for maintaining MB at a high logic level when the precharge device is off and either A or W or both has a low logic level: in this example a weak PMOS device performs this function.

Figure 4:
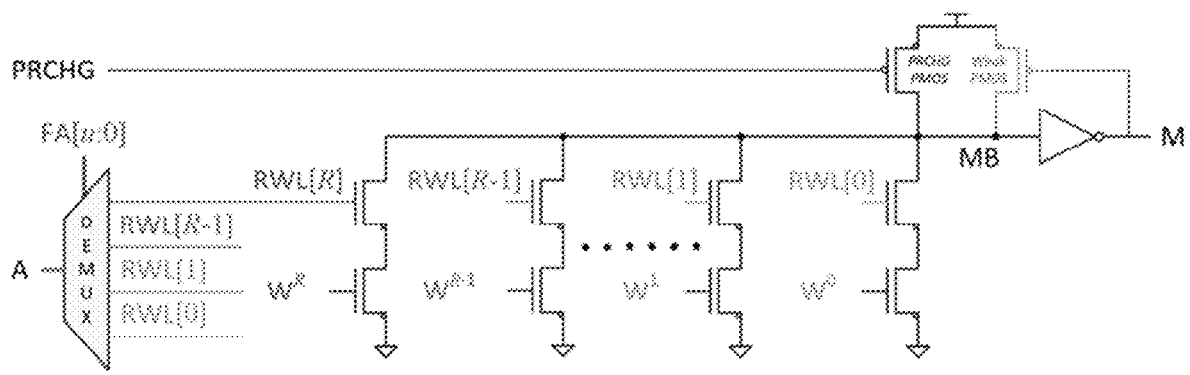
FIG. 4 illustrates that a CIM cell 1 may have a plurality of memory cells storing respective weights W and a demultiplexer 12 that provides the input A to a transistor gate of a selected multiplier path corresponding to the selected weight W.

FIG. 4 illustrates that a CIM cell may have a plurality of memory cells storing respective weights W and a demultiplexer 12 that provides the input A to a transistor gate of a selected multiplier path corresponding to the selected weight W.

Figure 5:
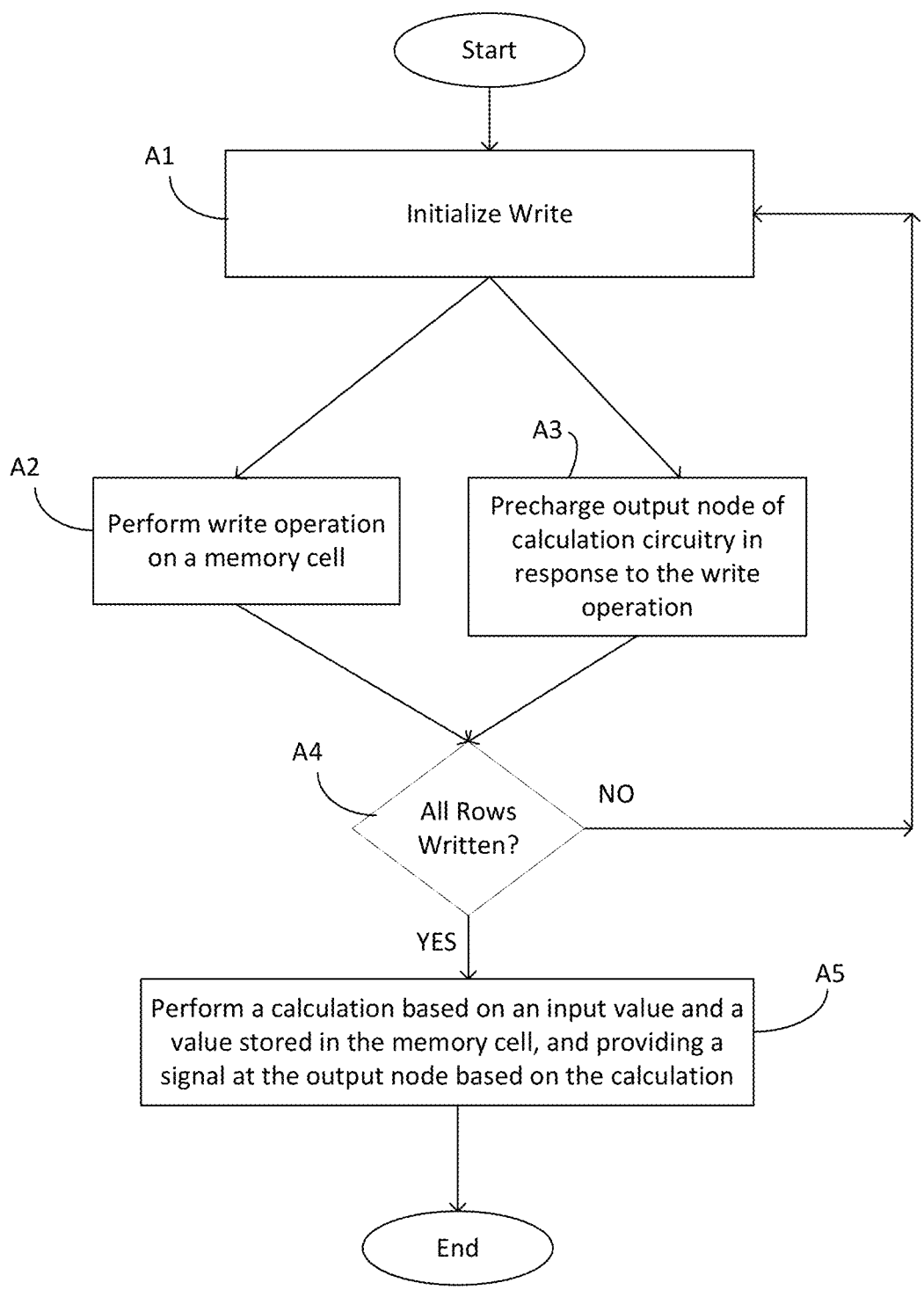
FIG. 5 illustrates a method of operating a CIM device.

FIG. 5 shows a flowchart illustrating a method of operating a CIM device. A write operation for a row of memory cells of the CIM device is initialized in act A1. A write operation is then performed on the row in act A2. An output node of calculation circuitry for the memory cells in the row being written in act A2 is precharged in act A3. The act A3 may be performed in response to a signal indicating that a write operation for the cell or row of cells is being performed in act A2. The act A3 may be performed concurrently with act A2. Act A3 may be performed at least in part by turning on a precharge transistor 4*a* (FIG. 3), as described above. Write operations may continue until write operations have been performed for all rows of the CIM device. For example, in act A4, it may be determined whether all rows have been written. If not, the method may return to act A1 and perform acts A1-A3 on another row of the memory, and the acts A1-A4 for respective rows may be repeated until all rows have been written. Once all rows have been written, the CIM device may control a compute operation to be performed in act A5. During the compute operation, a calculation may be performed based on an input value and a value stored in a memory cell, as described above. The result of the calculation is provided as a signal at the output node. The compute operation may be performed for all rows of the CIM device. However, in other embodiments, the compute operation in act A5 may be performed for one or more rows before all rows of the CIM device have been written.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A compute-in-memory (CIM) device, comprising:
   a memory cell;
   calculation circuitry configured to perform a calculation based on an input value and a value stored in the memory cell, and to provide a signal at an output node based on the calculation;
   write circuitry configured to perform a write operation on the memory cell;
   precharge circuitry configured to precharge the output node in response to the write circuitry performing the write operation; and
   logic circuitry configured to detect that the write operation is being performed on the memory cell, and to control the precharge circuitry to precharge the output node in response to detecting that the write operation is being performed on the memory cell.

2. The CIM device of claim 1, wherein the calculation comprises multiplication.

3. The CIM device of claim 1, wherein the precharge circuitry comprises a transistor configured to precharge the output node by coupling the output node to a power rail.

4. The CIM device of claim 3, wherein the transistor comprises a PMOS transistor.

5. The CIM device of claim 1, wherein the precharge circuitry is configured to precharge the output node during the write operation.

6. The CIM device of claim 1, wherein the value stored in the memory cell comprises a filter weight.

7. The CIM device of claim 1, wherein the write circuitry is configured to perform write operations for a row of memory cells, and the precharge circuitry is configured to precharge output nodes of calculation circuitry configured to perform operations using values stored in the row of memory cells, wherein the precharge circuitry is configured to precharge the output nodes in response to the write operations.

8. The CIM device of claim 1, wherein the precharge circuitry is configured to precharge the output node prior to the calculation being initiated.

9. The CIM device of claim 1, wherein the memory cell includes a static random access memory (SRAM) cell and/or a ternary content addressable memory (TCAM) cell.

10. A compute-in-memory (CIM) method, comprising:
performing a write operation on a memory cell;
precharging an output node in response to the performing of the write operation;
performing a calculation based on an input value and a value stored in the memory cell and providing a signal at the output node based on the calculation; and
detecting that the write operation is being performed on the memory cell; and precharging the output node in response to detecting that the write operation is being performed on the memory cell.

11. The CIM method of claim 10, wherein the calculation comprises multiplication.

12. The CIM method of claim 10, wherein the precharging is performed through coupling the output node to a power rail using a transistor.

13. The CIM method of claim 12, wherein the transistor comprises a PMOS transistor.

14. The CIM method of claim 10, wherein the precharging is performed during the write operation.

15. The CIM method of claim 10, wherein the value stored in the memory cell comprises a filter weight.

16. The CIM method of claim 10, further comprising: performing write operations for a row of memory cells; and precharging, in response to the write operations, output nodes of calculation circuitry configured to perform operations using values stored in the row of memory cells.

17. The CIM method of claim 10, wherein the precharging of the output node is performed prior to the calculation being initiated.

18. The CIM method of claim 10, wherein the memory cell includes a static random access memory (SRAM) cell and/or a ternary content addressable memory (TCAM) cell.

* * * * *